(12) United States Patent  
Robert

(10) Patent No.: US 8,804,339 B2
(45) Date of Patent: Aug. 12, 2014

(54) POWER ELECTRONICS ASSEMBLIES, INSULATED METAL SUBSTRATE ASSEMBLIES, AND VEHICLES INCORPORATING THE SAME

(75) Inventor: Brian Joseph Robert, Saint Clair Shores, MI (US)

(73) Assignee: Toyota Motor Engineering & Manufacturing North America, Inc., Erlanger, KY (US)

(*) Notice: Subject to any disclaimer, the term of this patent is extended or adjusted under 35 U.S.C. 154(b) by 587 days.

(21) Appl. No.: 13/036,447

(22) Filed: Feb. 28, 2011

(65) Prior Publication Data

US 2012/0218714 A1   Aug. 30, 2012

(51) Int. Cl.
   *H05K 7/20* (2006.01)

(52) U.S. Cl.
   USPC ........... 361/713; 361/707; 361/719; 361/760; 361/807; 174/252; 174/260; 174/520; 174/547; 174/548; 257/704; 257/712

(58) Field of Classification Search
   USPC ............. 361/676–678, 679.46–679.54, 361/688–722, 760–762, 767, 807–809
   See application file for complete search history.

(56) References Cited

U.S. PATENT DOCUMENTS

| | | | |
|---|---|---|---|
| 5,621,243 A * | 4/1997 | Baba et al. | 257/712 |
| 5,834,848 A | 11/1998 | Iwasaki | |
| 6,028,364 A | 2/2000 | Ogino et al. | |
| 6,097,085 A | 8/2000 | Ikemizu et al. | |
| 6,423,571 B2 * | 7/2002 | Ogino et al. | 438/106 |
| 6,509,529 B2 | 1/2003 | Kamath et al. | |
| 6,657,134 B2 | 12/2003 | Spielberger et al. | |
| 6,809,380 B2 | 10/2004 | Matsuhashi | |
| 6,906,413 B2 | 6/2005 | Bish et al. | |
| 8,247,699 B2 * | 8/2012 | Shen | 174/254 |
| 8,411,442 B2 * | 4/2013 | Meinel et al. | 361/712 |
| 2002/0011657 A1 | 1/2002 | Saito | |
| 2002/0171134 A1 * | 11/2002 | Choi | 257/678 |
| 2009/0309212 A1 * | 12/2009 | Shim et al. | 257/700 |
| 2012/0063093 A1 * | 3/2012 | Meinel et al. | 361/707 |

OTHER PUBLICATIONS

Nozama, N., Maekawa, T., Nozawa, S., Asakura, K., "Development of Power Control Unit for Compact-Class Vehicle," SAE Technical Paper 09-PLF-1254, 2009.

Schulz-Harder, J., "Direct Copper Bonded Substrates for Semiconductor Power Devices," Curamik Electronics GMBH, Retrieved Sep. 15, 2010, from http://www.electrovac.com/servlet/com.itmr.waw.servket.FileViewer?dokmanid=231290&kdid=160108&sprachid=1.

Schulz-Harder, J., "Direct Cooper Bonded Substrates for Semiconductor Power Devices," Curamik Electronics GMBH, Retrieved Sep. 15, 2010, from http://www.electrovac.com/servlet/com.itmr.waw.servlet.FileViewer?dokmanid=231290&kdid=160108&sprachid=1.

* cited by examiner

*Primary Examiner* — Courtney Smith
(74) *Attorney, Agent, or Firm* — Dinsmore & Shohl LLP

(57) ABSTRACT

A power electronics assembly includes a semiconductor device, an insulated metal substrate, and a cooling structure. The insulated metal substrate includes a dielectric layer positioned between first and second metal layers, and a plurality of stress-relief through-features extending through the first metal layer, the second metal layer, the dielectric layer, or combinations thereof. The semiconductor device is thermally coupled to the first metal layer and the plurality of stress relief through-features is positioned around the semiconductor device. The cooling structure is bonded directly to the second metal layer of the insulated metal substrate. Insulated metal substrate assemblies are also disclosed. The insulated metal substrate includes a plurality of stress-relief through-features extending through a first metal layer, a second metal layer, and a dielectric layer. Vehicles having power electronics assemblies with stress-relief through-features are also disclosed.

18 Claims, 7 Drawing Sheets

POWER ELECTRONICS ASSEMBLIES, INSULATED METAL SUBSTRATE ASSEMBLIES, AND VEHICLES INCORPORATING THE SAME

TECHNICAL FIELD

The present specification generally relates to power electronics assemblies, and more particularly, power electronics assemblies and vehicles having insulated metal substrates with integral stress-relief through-features.

BACKGROUND

Power electronics devices are often utilized in high-power electrical applications, such as inverter systems for hybrid electric vehicles and electric vehicles. Power semiconductor devices such as power IGBTs and power transistors, for example, may be thermally coupled to an insulated metal substrate comprising a dielectric layer positioned between two metal layers. The insulated metal substrate may then be further thermally coupled to a cooling structure, such as a heat sink. During operation of power electronics devices, thermally-induced stresses occur within the packaged structure due to coefficient of thermal expansion (CTE) mismatch of the structure's component layers.

Operation of the power semiconductor devices may generate high thermal loads that may cause the layers of the insulated metal substrate to flex due to CTE mismatch, which could damage the insulated metal substrate and/or the power electronics device package. To alleviate thermally-induced stresses, a punched metal base plate has been used as an interface layer between the bottom layer of the insulated metal substrate and the cooling structure. The punched metal base plate has patterned through-holes positioned therethrough. The punched metal base plate helps to relieve stress on the insulated metal substrate during a brazed bond process (which may require a large amount of heat), as well as to relieve operational stresses caused by CTE mismatch under transient thermal conditions.

However, the addition of the punched metal base plate increases the cost of the overall power electronics assembly and also increases its size. Further, use of the punched metal base plate causes increased thermal resistance within the package. There exists a desire to reduce the cost and size of electrical components utilized in electrical systems while also optimizing thermal management.

Accordingly, a need exists for alternative power electronics assemblies, insulated metal substrates, and vehicles that optimize thermal performance.

SUMMARY

In one embodiment, a power electronics assembly includes a semiconductor device, an insulated metal substrate, and a cooling structure. The insulated metal substrate includes a dielectric layer positioned between a first metal layer and a second metal layer, and a plurality of stress-relief through-features extending through the first metal layer, the second metal layer, the dielectric layer, or combinations thereof. The semiconductor device is thermally coupled to the first metal layer, and the plurality of stress relief through-features is positioned around the semiconductor device. The cooling structure is bonded directly to the second metal layer of the insulated metal substrate.

In another embodiment, a vehicle includes an inverter circuit having at least one power electronics assembly and an electric motor electrically coupled to the inverter circuit and mechanically coupled to a plurality of wheels. The power electronics assembly includes a semiconductor device, an insulated metal substrate, and a cooling structure. The insulated metal substrate includes a dielectric layer positioned between a first metal layer and a second metal layer, and a plurality of stress-relief through-features extending through the first metal layer, the second metal layer, the dielectric layer, or combinations thereof. The semiconductor device is thermally coupled to the first metal layer, and the plurality of stress relief through-features is positioned around the semiconductor device. The cooling structure is thermally coupled to the second metal layer and is operable to remove heat flux generated by the semiconductor device during operation of the power electronics assembly. The electric motor is electrically coupled to the inverter circuit and mechanically coupled to a plurality of wheels.

In yet another embodiment, an insulated metal substrate assembly includes a first metal layer configured to be bonded to a heat generating device, a second metal layer, a thermally conductive dielectric layer positioned between the first and second metal layers, and a cooling structure directly bonded to the second metal layer. The insulated metal substrate further includes a plurality of stress-relief through-features extending through the first metal layer, the second metal layer, and the dielectric layer. The plurality of stress-relief through-features is positioned around a perimeter of the first metal layer and the second metal layer. The cooling structure is operable remove heat flux from the heat generating device coupled the first metal layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 1:
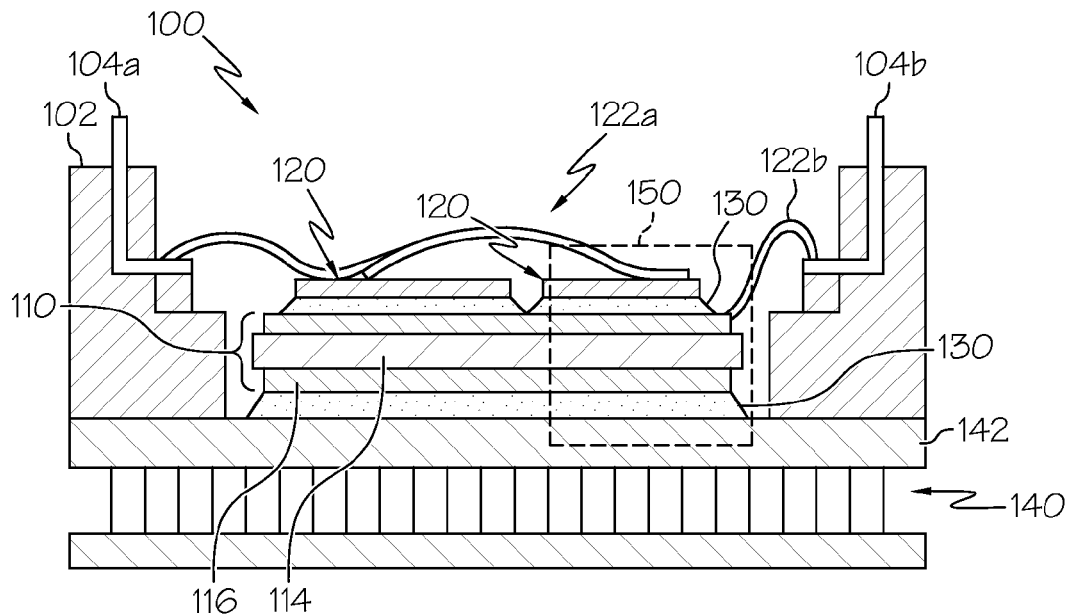
FIG. 1 schematically depicts a side view of a power electronics assembly having an insulated metal substrate according to one or more embodiments shown and described herein.
Figure 2A:
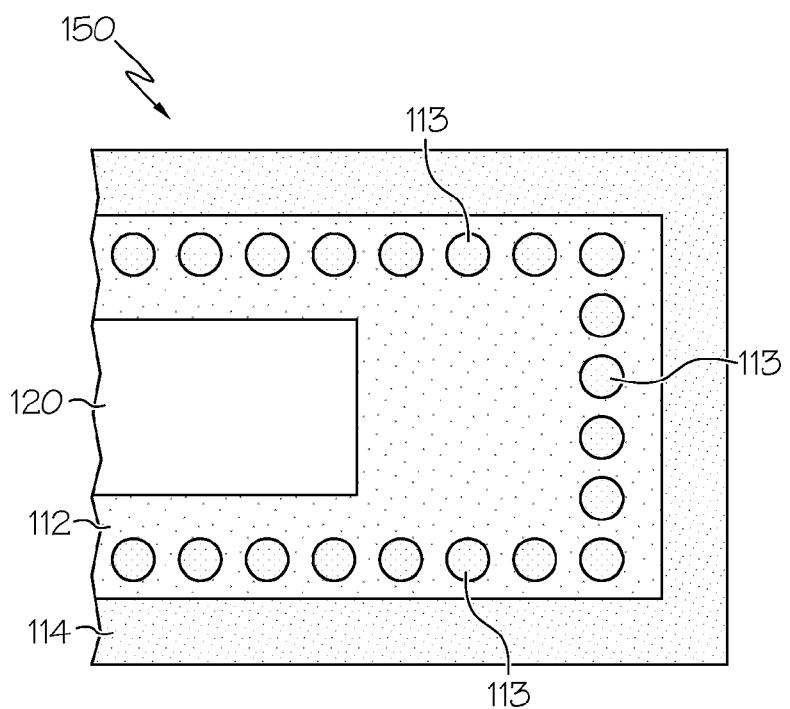
FIGS. 2A and 2B schematically depict a partial top view of a power electronics assembly having a plurality of stress-relief through-features positioned through a first metal layer of an insulated metal substrate according to one or more embodiments shown and described herein.

FIGS. 1 and 2A generally depicts one embodiment of a power electronics assembly. The power electronics assembly comprises a directed bonded insulated metal substrate having a plurality of stress-relief through-features that alleviate thermally-induced stresses during fabrication and operation of the power electronics assembly due to coefficient of thermal expansion (CTE) mismatch of the layers and components of the power electronics assembly. The stress-relief through-features may eliminate the need for additional interface layers between the insulated metal substrate and the cooling device such as a heat sink or a liquid cooling assembly. The stress-relief through-features may extend through all or some of the layers of the insulated metal substrate. Various embodiments of power electronic assemblies, vehicles, and insulated metal substrate assemblies will be described in more detail herein.

Referring initially to FIG. 1, one embodiment of a power electronics assembly 100 is illustrated. The power electronics assembly 100 generally comprises a insulated metal substrate assembly 110, two semiconductor devices 120, a cooling structure 140, and a package housing 102. The insulated metal substrate 110 may be a direct bonded copper (DBC) structure, a direct bonded aluminum (DBA) structure, an active metal brazed insulated metal substrate, or other similar power module substrate. The insulated metal substrate 110 may include a first metal layer 112, a thermally conductive dielectric layer 114, and a second metal layer 116. The first and second metal layers 112, 116 are directly bonded to the dielectric layer 114. The first and second metal layers 112, 116 may be made of an electrically conductive metal material (e.g., copper, aluminum, etc). The thickness of the first and second metal layers 112, 116 may depend on the intended use of the power electronics assembly. In one embodiment, the first and second metal layers 112, 116 have a thickness within the range of about 0.25 mm to about 0.6 mm. It should be understood that other thicknesses may be utilized.

The dielectric layer 114 may be made of an electrically insulative, thermally conductive material such that there is no electrical connection between the first and second metal layers 112, 116. The dielectric layer 114 may comprise a ceramic material, such as alumina ($Al_2O_3$), aluminum nitride (AlN), silicon nitride ($Si_3N_4$), beryllium oxide (BeO), silicon carbide (SiC), and the like. The dielectric layer 114 should be capable of conducting heat flux generated by the semiconductor devices 120 during operation of the power electronics assembly 100 and transferring the heat flux to the second metal layer 116 and cooling structure 140 as described below. The thickness and size of the dielectric layer 114 may depend on the application in which the power electronics assembly is to operate. In one embodiment, the dielectric layer 114 has a thickness within a range of about 0.3 mm to about 1.0 mm. It should be understood that other thicknesses may be utilized.

As depicted in FIG. 1, two semiconductor devices 120 are bonded to the first metal layer 112 of the insulated metal substrate 110 via a bond layer 130. In one embodiment, the bond layer 130 may be a solder layer. In another embodiment, the semiconductor devices 120 are bonded to the first metal layer 112 by braze bonding. Other bonding methods may be utilized. More or fewer semiconductor devices may be attached to the first metal layer 112. In some embodiments, heat generating devices other than power semiconductor devices may be attached to the first metal layer 112. The semiconductor devices 120 may be power semiconductor devices such as IGBTs, power diodes, power MOSFETs, power transistors, and the like. In one embodiment, the semiconductor devices of one or more power electronics assemblies are electrically coupled to form an inverter circuit or system for vehicular applications, such as for hybrid vehicles or electric vehicles, for example.

The insulated metal substrate 110 is thermally coupled to the cooling structure 140 at the second metal layer 116. In one embodiment, the cooling structure 140 comprises an air-cooled heat sink. In an alternative embodiment, the cooling structure 140 comprises a liquid-cooled heat sink, such as a jet impingement or channel-based heat sink device. The insulated metal substrate 110 of the illustrated embodiment is directly bonded to a first surface 142 of the cooling structure 140 via a bond layer 130 without any additional interface layers (e.g., additional metal base plates). The insulated metal substrate 110 may be bonded to the cooling structure 140 using a variety of bonding techniques, such as by solder, brazing, or diffusion bonding, for example. However, in an alternative embodiment, one or more thermally conductive interface layers may be positioned between the second metal layer 116 and the first surface of the cooling structure 140.

Still referring to FIG. 1, the insulated metal substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example.

Within the module housing may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 122a, and the second electrical contact 104b is electrically coupled to a second surface of the semiconductor devices 120 via a second electrical wire 122b and the first metal layer 112 of the insulated metal substrate 110. It should be understood that other electrical and mechanical configurations are possible, and that embodiments are not limited by the arrangement of the components illustrated in the figures.

Figure 2B:
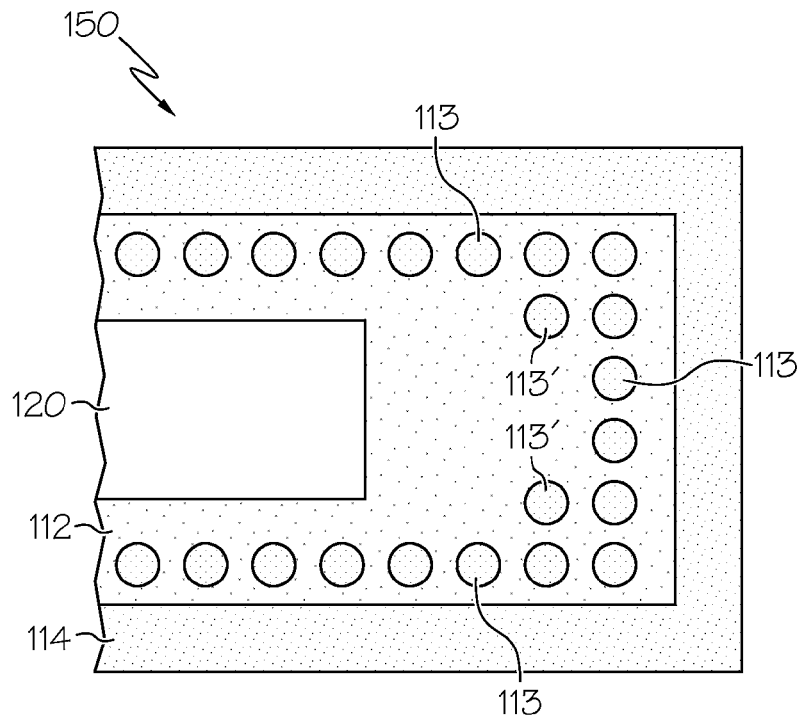
Figure 2C:
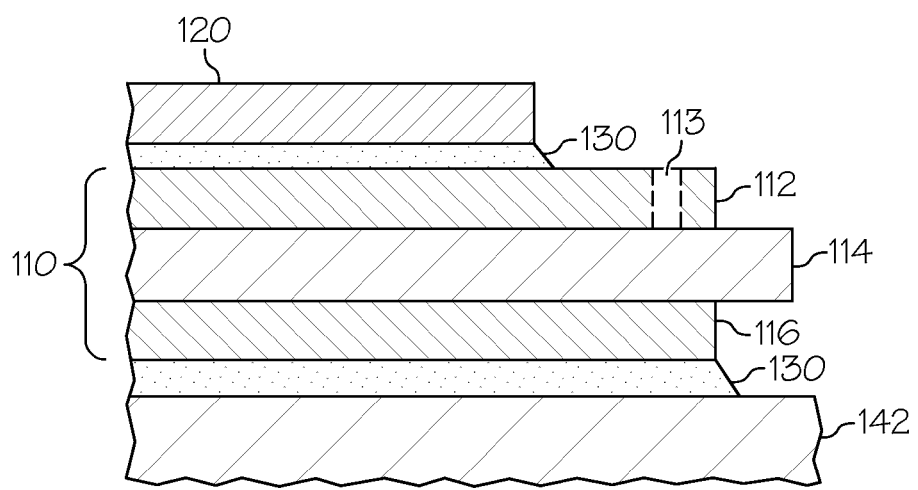
FIG. 2C schematically depicts a partial cross-sectional view of a power electronics assembly having a plurality of stress-relief through-features positioned through a first metal layer of an insulated metal substrate.

Referring now to FIGS. 2A-2C, the region of power electronics assembly 100 illustrated in FIG. 1 and designated by box 150 is schematically depicted. FIGS. 2A and 2B depict top views of two embodiments of an insulated metal substrate 110, and FIG. 2C depicts a cross-sectional view of an insulated metal substrate 110. The insulated metal substrate 110 comprises a plurality of stress-relief through-features 113 that extends through the first metal layer 112. In an alternative embodiment, a second plurality of stress-relief through-features may also extend through the second metal layer 116.

The stress-relief through-features described herein are provided within one or more layers (e.g., the first metal layer 112) of the insulated metal substrate 110 to remove thermally-induced stresses during fabrication (e.g., brazing the insulated metal substrate 110 to the cooling structure 140) and operational conditions (e.g., transient electric loads causing high changes in temperature). Because the components and layers of the power electronics assembly 100 are made of differing materials, differences in CTE may cause high thermally-induced stresses that may cause failure of the assembly due to fracturing or other mechanical failures. The use of the stress-relief through-features within various layers of the insulated metal substrate allow for the alleviation of such stresses without the need for additional interface layers. The stress-relief through-features described herein control the thermal expansion experienced by the insulated metal substrate. In some embodiments, the stress-relief through-features described herein may be filled with a compliant material to manipulate rates of bulk expansion.

The stress-relief through-features described herein should be located around the semiconductor device 120. To optimize thermal transfer between the semiconductor device(s) 120 and the insulated metal substrate 110, the stress-relief through-features should not be located underneath the semiconductor device 120. However, in applications where optimization of thermal transfer between the semiconductor device and the insulated metal substrate is not of particular concern, the stress-relief through-features may be located underneath the semiconductor device.

Generally, the shape of the stress-relief through-features in cross-section should not have sharp corners (e.g., shapes such as squares, rectangles, triangles, etc.) and should be circular or elliptical. Stress-relief through-features having sharp corners may cause high stresses at such corners and may lead to mechanical failure.

As shown in FIG. 2C, the stress-relief through-features 113 fully extend through the first metal layer 112 to the dielectric layer 114. The stress-relief through-features 113 may be generally cylindrical but may have a taper depending on the method used to fabricate the stress-relief through-features 113. In embodiments that do not use liquidus bonding techniques to bond the insulated metal substrate 110 to the first surface 142 of the cooling structure 140, a second plurality of stress-relief through-features (not shown) may be provided through the second metal layer 116.

The stress-relief through-features 113 may be fabricated using a variety of techniques. In one embodiment, the stress-relief through-features 113 are fabricated using a chemical etching process in which a patterned mask is applied to the metal layer and a chemical etchant is used to form the through holes. In another embodiment, the stress-relief through-features may be formed using mechanical or laser drilling.

As shown in FIGS. 2A-2C, the stress-relief through-features 113 may be linearly located along the edge of the first metal layer 112. Stress at the metal/dielectric interface may be minimized by reducing the mass at the metal edges using through-metallization geometries. Although the stress-relief through-features 113 are illustrated as being linearly arranged, embodiments are not limited thereto. For example, the stress-relief through-features may be arranged randomly or in a pattern. In the embodiment illustrated in FIG. 2B, additional stress-relief through-features 113' are located near the corners of the first metal layer 112 where thermally-induced stress tends to be particularly prevalent. The additional stress-relief through-features 113' may further alleviate stress at these areas of the first metal layer 112 (or second metal layer 116). Additional patterns may be used at the corners of the metal layers as well as other areas to reduce stresses resulting from particular applications and operational conditions.

Figure 3A:
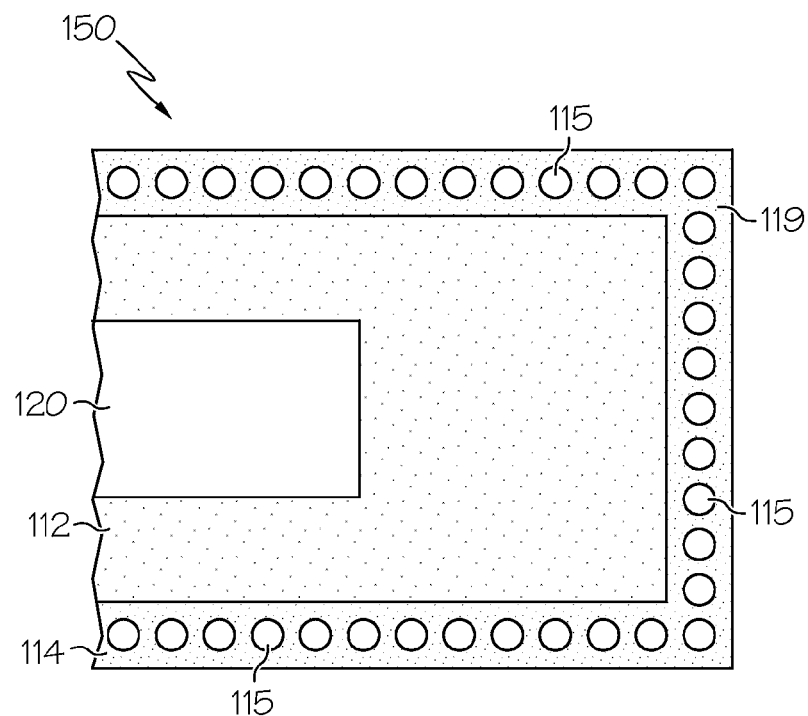
FIG. 3A schematically depicts a partial top view of a power electronics assembly having a plurality of stress-relief through-features positioned through a dielectric layer of an insulated metal substrate according to one or more embodiments shown and described herein.
Figure 3B:
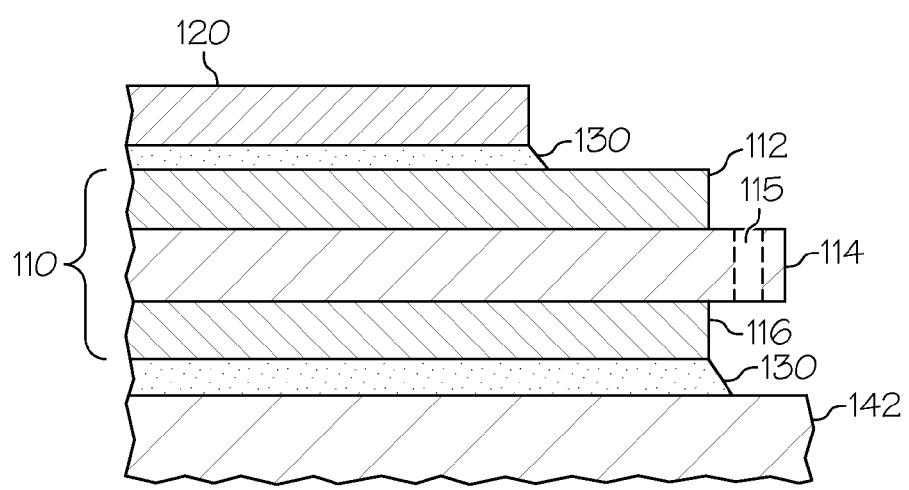
FIG. 3B schematically depicts a partial cross-sectional view of a power electronics assembly having a plurality of stress-relief through-features positioned through a dielectric layer of an insulated metal substrate.

FIGS. 3A and 3B depict an embodiment wherein a plurality of stress-relief through-features 115 extend only through the dielectric layer 114 and not the first and second metal layers 112, 116. The surface area of the dielectric layer 114 is larger than the surface area of the first and second metal layers 112, 116 such that a ledge feature 119 is formed by the dielectric layer 114 with respect to the first and second metal layers 112, 116. The plurality of stress-relief through-features 115 may be located along this ledge feature 119 such that the stress-relief through-features 115 fully extend only through the dielectric layer 114. As shown in FIG. 3B, the stress-relief through-features 115 that extend through the dielectric layer 114 may be generally cylindrical in shape. However, the stress-relief through-features 115 may have a taper depending on fabrication techniques. The stress-relief through-features 115 through the dielectric layer 114 may alleviate thermally-induced stress at the metal layer/dielectric layer and metal layer/cooling structure interfaces.

The size and spacing of the stress-relief through-features 115 fabricated through the dielectric layer 114 may depend on the overall size of the insulated metal substrate 110, the application in which the insulated metal substrate 110 is to be implemented, the fabrication technique used to make the stress-relief through-features, etc. As an example and not a limitation, the stress-relief through-features 115 may be fabricated through the dielectric layer 114 using a laser drilling process. The features 115 may also be fabricated using mechanical drilling depending on the size of the features 115 to be drilled.

Figure 4A:
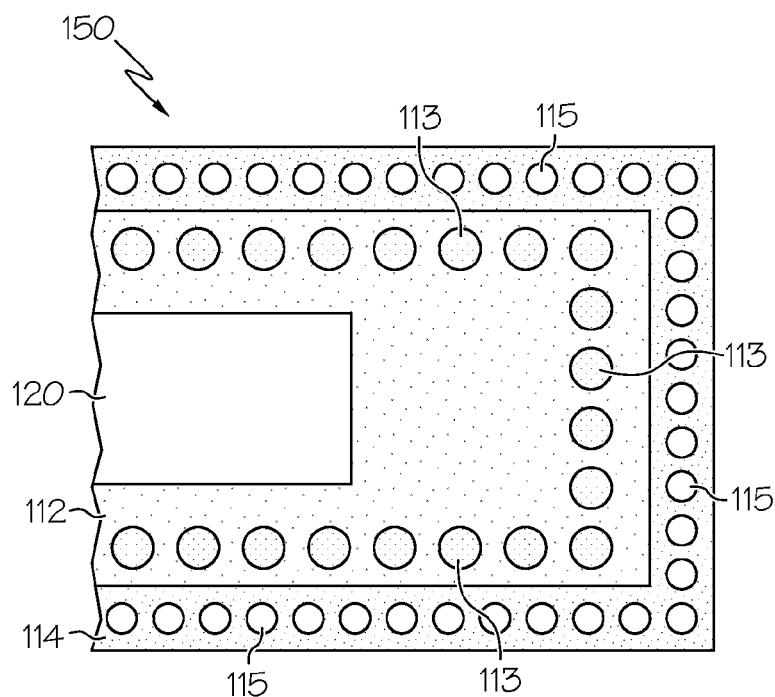
FIGS. 4A and 4B schematically depict a partial top view of a power electronics assembly having a first plurality of stress-relief through-features positioned through a first metal layer of an insulated metal substrate and a second plurality of stress-relief through-features positioned through a dielectric layer of the insulated metal substrate according to one or more embodiments shown and described herein.
Figure 4B:
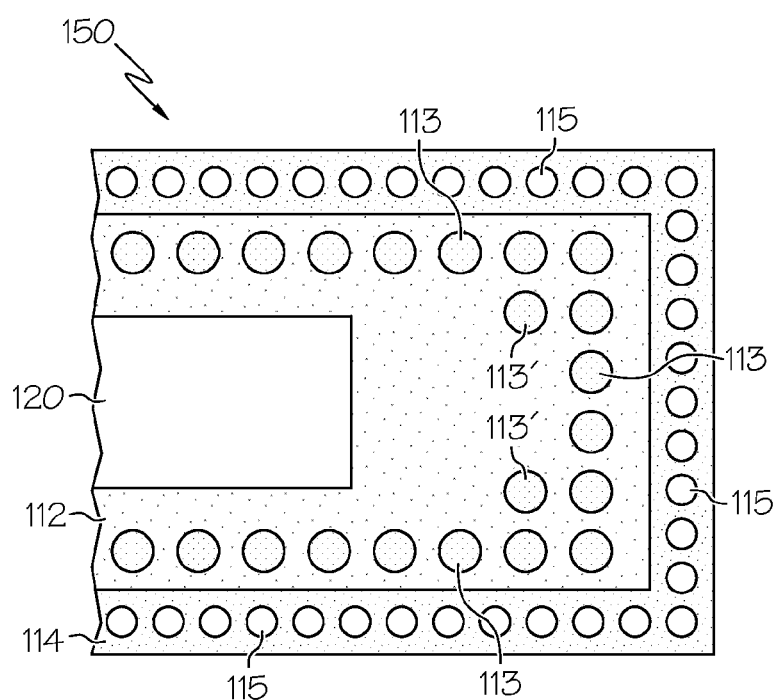
Figure 4C:
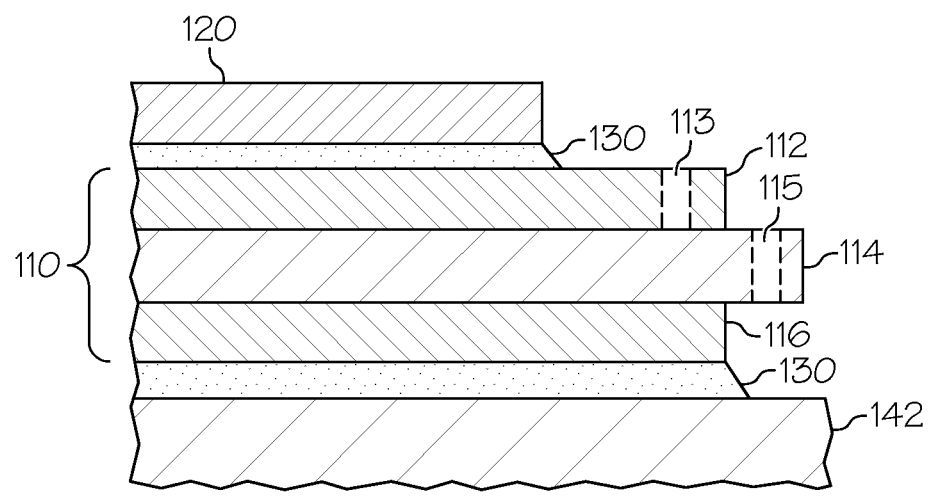
FIG. 4C schematically depicts a partial cross-sectional view of a power electronics assembly having a first plurality of stress-relief through-features positioned through a first metal layer of an insulated metal substrate and a second plurality of stress-relief through-features positioned through a dielectric layer of the insulated metal substrate according to one or more embodiments shown and described herein.

FIGS. 4A-4C depict embodiments in which a first plurality of stress-relief through-features 113 extends through the first metal layer 112 as described above with respect to the embodiments depicted in FIGS. 2A-2C, and a second plurality of stress-relief through-features 115 extends through the dielectric layer 114 as described above with respect to the embodiment depicted in FIGS. 3A and 3B. In the embodiment illustrated in FIG. 3B, additional stress-relief through-features 113' are located near the corners of the first metal layer 112 where thermally-induced stress tends to be particularly prevalent. In an alternative embodiment, a third plurality of stress-relief through-features (not shown) may extend through the second metal layer 116. The through-metallization and through-dielectric stress-relief through-features may reduce stresses from CTE mismatch and increase the insulated metal substrate temperature transient lifetime.

Figure 5A:
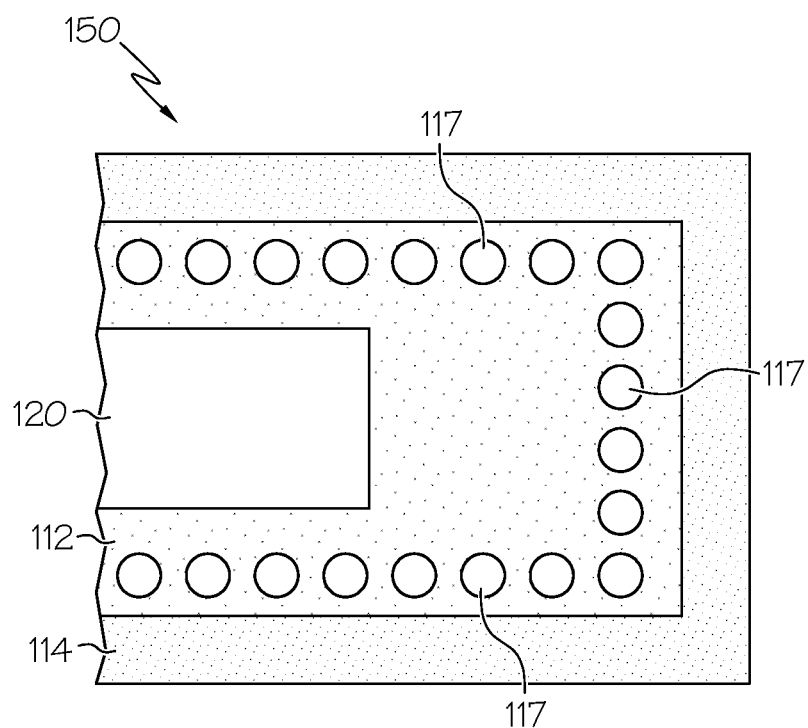
FIGS. 5A and 5B schematically depict a partial top view of a power electronics assembly having a plurality of stress-relief through-features positioned through a first metal layer, a dielectric layer, and a metal layer of an insulated metal substrate according to one or more embodiments shown and described herein.
Figure 5B:
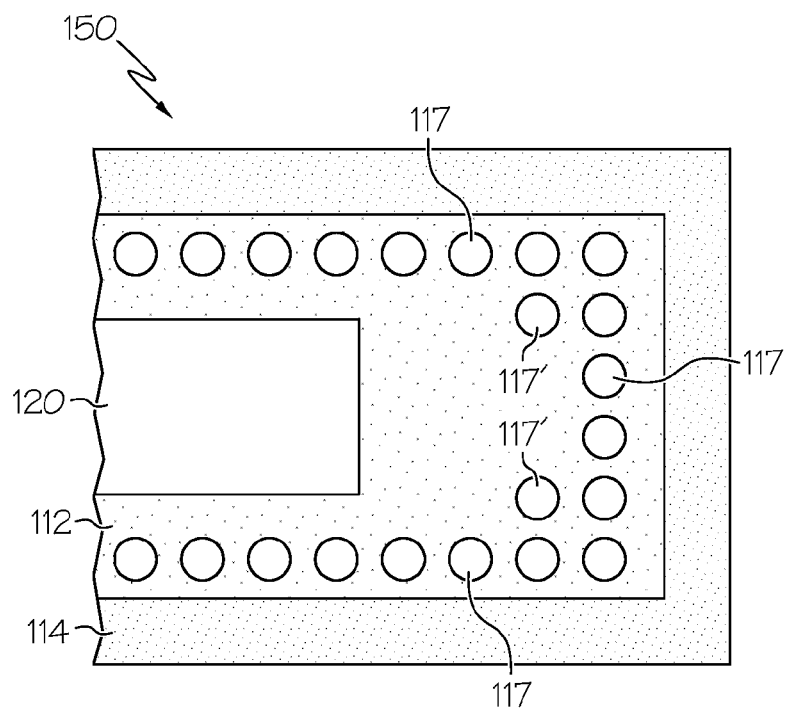
Figure 5C:
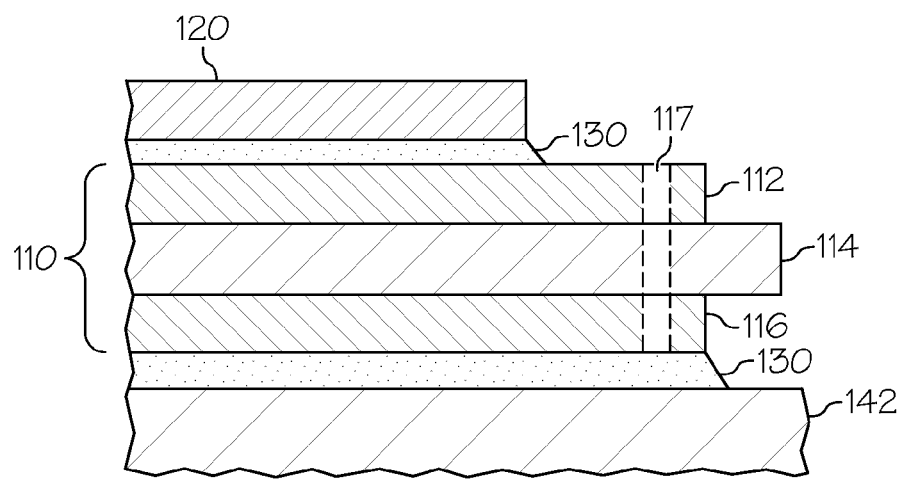
FIG. 5C schematically depicts a partial cross-sectional view of a power electronics assembly having a plurality of stress-relief through-features positioned through a first metal layer, a dielectric layer, and a metal layer of an insulated metal substrate according to one or more embodiments shown and described herein.

FIGS. 5A and 5B depict an embodiment in which a plurality of stress-relief through-features 117 extends fully through the first metal layer 112, the dielectric layer 114, and the second metal layer 116. The stress-relief through-features 117 may be formed by laser or mechanically drilling. As described above with respect to FIGS. 2B and 4B, additional stress-relief through-features 117' may be located near the corners of the first and second metal layers 112, 116 to aid in relieving thermally-induced stress located at such corners (FIG. 5B). The stress-relief through-features 117, 117' that fully extend through all of the layers of the insulated metal substrate may reduce stresses from CTE mismatch and increase the insulated metal substrate temperature transient lifetime.

Figure 6:
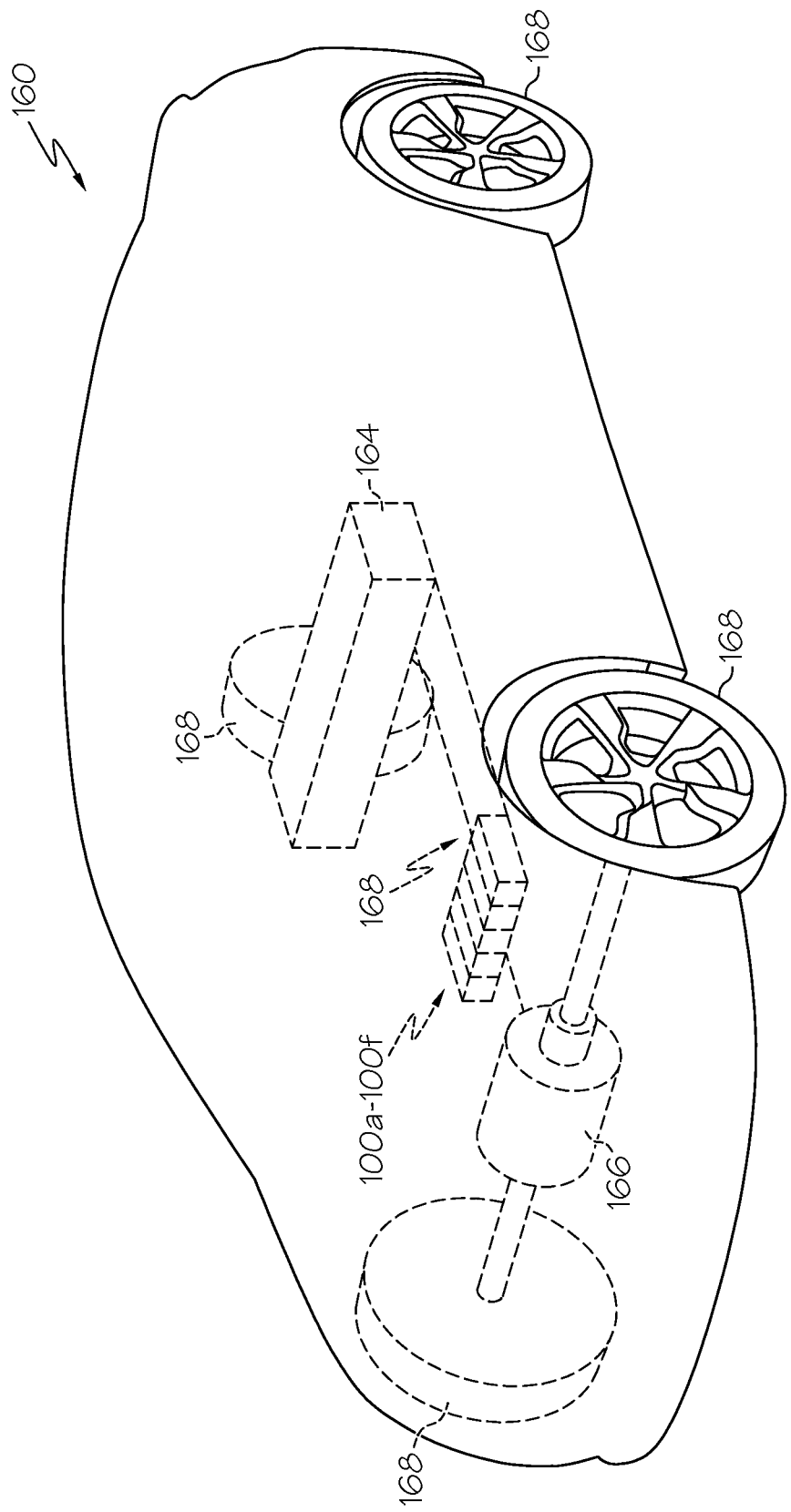
FIG. 6 schematically depicts a vehicle having a plurality of power electronics assemblies according to one or more embodiments shown and described herein.

As stated above, the insulated metal substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 6, several power electronics assemblies 100a-100f may be electrically coupled together to form a drive circuit 162 that converts direct current electrical power provided by a bank of batteries 164 into alternating electrical power that is used to drive an electric motor coupled 166 to the wheels 168 of the vehicle 160 to propel the vehicle using electric power. The power electronics assemblies 100a-100f used in the drive circuit 162 may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which may lead to thermally-induced stresses due to CTE mismatch. The stress-relief through-features described and illustrated herein may reduce the thermally-induced stresses by manageably controlling the thermal expansion experienced by the layers of the insulated metal substrate on which the semiconductor devices are coupled while also providing a compact package design.

It should now be understood that the stress-relief through-features of the insulated metal substrates incorporated into the power electronics assemblies and vehicles described herein may be utilized to reduce thermally-induced stresses due to CTE mismatch without the need for additional interface layers, thereby providing for a more compact package design with reduced thermal resistance. Depending on the particular application, the stress-relief through-features may extend through the first metal layer, the dielectric layer, the second metal layer, or combinations thereof.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A power electronics assembly comprising:
a semiconductor device;
a direct-bonded insulated metal substrate comprising a dielectric layer positioned between and direct-bonded to a first metal layer and a second metal layer, and a plurality of stress-relief through-features extending through the first metal layer, the second metal layer, and the dielectric layer, wherein the semiconductor device is thermally coupled to the first metal layer and the plurality of stress-relief through-features is positioned around the semiconductor device; and
a cooling structure bonded directly to the second metal layer of the direct-bonded insulated metal substrate.

2. The power electronics assembly of claim 1 wherein the direct-bonded insulated metal substrate is a direct-bonded copper (DBC) structure.

3. The power electronics assembly of claim 1 wherein the semiconductor device is bonded to the first metal layer by a bond layer.

4. The power electronics assembly of claim 1 wherein the dielectric layer comprises $Al_2O_3$, AlN, $Si_3N_4$, BeO, or SiC.

5. The power electronics assembly of claim 1 wherein the direct-bonded insulated metal substrate further comprises a second plurality of stress-relief through-features that extends through the second metal layer.

6. The power electronics assembly of claim 5, wherein the direct-bonded insulated metal substrate further comprises a third plurality of stress-relief through-features that extends through the dielectric layer.

7. The power electronics assembly of claim 1 wherein the direct-bonded insulated metal substrate further comprises a second plurality of stress-relief through-features that extends through the first metal layer or the second metal layer.

8. The power electronics assembly of claim 1 wherein individual ones of the plurality of stress-relief through-features are linearly arranged through the direct-bonded insulated metal substrate.

9. The power electronics assembly of claim 1 wherein individual ones of the plurality of stress-relief through-features are non-linearly arranged through the direct-bonded insulated metal substrate.

10. A vehicle comprising:
an inverter circuit comprising a power electronics assembly, the power electronics assembly comprising:
a semiconductor device;
a direct-bonded insulated metal substrate comprising a dielectric layer positioned between and direct-bonded to a first metal layer and a second metal layer, and a plurality of stress-relief through-features extending through the first metal layer, the second metal layer and, the dielectric layer, wherein the semiconductor device is thermally coupled to the first metal layer and the plurality of stress-relief through-features is positioned around the semiconductor device; and
a cooling structure thermally coupled to the second metal layer and operable to remove heat flux generated by the semiconductor device during operation of the power electronics assembly; and
an electric motor electrically coupled to the inverter circuit and mechanically coupled to a plurality of wheels.

11. The vehicle of claim 10 wherein the direct-bonded insulated metal substrate further comprises a second plurality of stress-relief through-features that extends through the first metal layer or the second metal layer.

12. A direct-bonded insulated metal substrate assembly comprising:
a first metal layer configured to be bonded to a heat generating device;
a second metal layer;
a thermally conductive dielectric layer positioned between and direct-bonded to the first and second metal layers;
a plurality of stress-relief through-features extending through the first metal layer, the second metal layer, and the thermally conductive dielectric layer, wherein the plurality of stress-relief through-features is positioned around a perimeter of the first metal layer and the second metal layer; and a cooling structure directly bonded to the second metal layer, wherein the cooling structure is operable to remove heat flux from the heat generating device coupled to the first metal layer.

13. The direct-bonded insulated metal substrate assembly of claim 12 wherein:

the thermally conductive dielectric layer comprises $Al_2O_3$, AlN, $Si_3N_4$, BeO, or SiC; and individual ones of the plurality of stress-relief through-features are linearly arranged through the first metal layer, the thermally conductive dielectric layer, and the second metal layer.

14. The direct-bonded insulated metal substrate assembly of claim 12 wherein the direct-bonded insulated metal substrate is a direct-bonded copper (DBC) structure.

15. The direct-bonded insulated metal substrate assembly of claim 12 wherein the heat generating device comprises a semiconductor device.

16. The direct-bonded insulated metal substrate assembly of claim 15 wherein the semiconductor device is bonded to the first metal layer by a bond layer.

17. The direct-bonded insulated metal substrate assembly of claim 12 further comprising a second plurality of stress-relief through-features that extends through the second metal layer.

18. The direct-bonded insulated metal substrate assembly of claim 12 wherein individual ones of the plurality of stress-relief through-features are non-linearly arranged through the direct-bonded insulated metal substrate.

* * * * *